(12) United States Patent
Miyata

(10) Patent No.: US 12,355,206 B2
(45) Date of Patent: Jul. 8, 2025

(54) LIGHT EMITTING DEVICE, PROJECTOR, AND DISPLAY

(71) Applicant: Seiko Epson Corporation, Tokyo (JP)

(72) Inventor: Takashi Miyata, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 592 days.

(21) Appl. No.: 17/705,808

(22) Filed: Mar. 28, 2022

(65) Prior Publication Data
US 2022/0311210 A1 Sep. 29, 2022

(30) Foreign Application Priority Data

Mar. 29, 2021 (JP) ................................ 2021-054824

(51) Int. Cl.
| | |
|---|---|
| H01S 5/042 | (2006.01) |
| G03B 21/20 | (2006.01) |
| G03B 33/12 | (2006.01) |
| H01S 5/34 | (2006.01) |
| H01S 5/343 | (2006.01) |

(52) U.S. Cl.
CPC ...... H01S 5/04256 (2019.08); G03B 21/2033 (2013.01); H01S 5/04257 (2019.08); H01S 5/341 (2013.01); H01S 5/34333 (2013.01); *G03B 33/12* (2013.01)

(58) Field of Classification Search
CPC .................. H01S 5/11; H01S 5/04257; H01S 5/341–3412
See application file for complete search history.

(56) References Cited

U.S. PATENT DOCUMENTS

| | | | | |
|---|---|---|---|---|
| 5,332,910 A | * | 7/1994 | Haraguchi | ............. H01S 5/183 |
| | | | | 257/17 |
| 9,620,559 B2 | * | 4/2017 | Schubert | ................. H01L 27/15 |
| 10,340,659 B1 | * | 7/2019 | Lin | ..................... H01S 5/18394 |

(Continued)

FOREIGN PATENT DOCUMENTS

| | | | | | |
|---|---|---|---|---|---|
| CN | 103811650 A | * | 5/2014 | ............ | H01L 24/24 |
| JP | 2004193527 A | * | 7/2004 | ............ | B82Y 20/00 |

(Continued)

*Primary Examiner* — Joshua King
(74) *Attorney, Agent, or Firm* — Harness, Dickey & Pierce, P.L.C.

(57) ABSTRACT

In the light emitting device, each of columnar parts includes a first semiconductor layer of a first conductivity type, a second semiconductor layer of a second conductivity type different from the first conductivity type, and a light emitting layer disposed between the first semiconductor layer and the second semiconductor layer, the first semiconductor layer is disposed between a substrate and the light emitting layer, a laminated structure has a third semiconductor layer of the first conductivity type disposed between the substrate and the plurality of columnar parts, a first electrode is electrically connected to the first semiconductor layer via the third semiconductor layer, a contact hole is disposed in an insulating layer at a position overlapping the first electrode when viewed from a stacking direction of the first semiconductor layer and the light emitting layer, the first wiring layer is provided to the insulating layer, and the first wiring layer is electrically connected to the first electrode via the contact hole.

13 Claims, 8 Drawing Sheets

(56) References Cited

U.S. PATENT DOCUMENTS

| | | | |
|---|---|---|---|
| 11,081,519 B2 | 8/2021 | Kaseya | |
| 11,133,444 B2 | 9/2021 | Kaseya | |
| 12,068,575 B2* | 8/2024 | Chen | H01S 5/11 |
| 2003/0038294 A1* | 2/2003 | Sano | H01S 5/04252 |
| | | | 257/745 |
| 2004/0144985 A1* | 7/2004 | Zhang | H01L 29/0673 |
| | | | 257/E29.071 |
| 2004/0157354 A1* | 8/2004 | Kuriyama | H01L 31/105 |
| | | | 438/45 |
| 2006/0208273 A1* | 9/2006 | Kang | H01L 33/08 |
| | | | 257/103 |
| 2007/0183472 A1* | 8/2007 | Lee | H01S 5/18369 |
| | | | 372/50.11 |
| 2012/0164767 A1* | 6/2012 | Gasse | H01L 27/153 |
| | | | 257/E33.061 |
| 2013/0052805 A1* | 2/2013 | Previtali | H01L 27/0694 |
| | | | 257/E21.09 |
| 2015/0280062 A1* | 10/2015 | Yoo | H01L 33/52 |
| | | | 257/13 |
| 2016/0027961 A1* | 1/2016 | Mi | H01L 33/18 |
| | | | 257/13 |
| 2016/0093665 A1* | 3/2016 | Schubert | H01L 33/507 |
| | | | 438/34 |
| 2016/0156157 A1* | 6/2016 | Matsubara | H01S 5/0042 |
| | | | 438/18 |
| 2018/0198047 A1* | 7/2018 | Danesh | H01L 33/24 |
| 2018/0254611 A1* | 9/2018 | Mayer | H01S 5/18369 |
| 2018/0269655 A1* | 9/2018 | Koyama | H01S 5/18377 |
| 2019/0198560 A1 | 6/2019 | Kaseya | |
| 2019/0252855 A1* | 8/2019 | Lu | H01S 5/2059 |
| 2020/0251629 A1 | 8/2020 | Kaseya | |
| 2020/0358251 A1 | 11/2020 | Tsuji | |
| 2020/0412099 A1* | 12/2020 | Miyata | H01S 5/04254 |
| 2021/0096452 A1 | 4/2021 | Miyata | |
| 2021/0119420 A1* | 4/2021 | Ra | H01S 5/341 |

FOREIGN PATENT DOCUMENTS

| | | | | |
|---|---|---|---|---|
| JP | 2005353828 A | * | 12/2005 | |
| JP | 2009076896 A | * | 4/2009 | |
| JP | 2009105182 A | * | 5/2009 | |
| JP | 2009140976 A | * | 6/2009 | |
| JP | 2010-135858 A | | 6/2010 | |
| JP | 2013-179215 A | | 9/2013 | |
| JP | 2014-512667 A | | 5/2014 | |
| JP | 2019-114739 A | | 7/2019 | |
| JP | 2020-184586 A | | 11/2020 | |
| JP | 2021-057443 A | | 4/2021 | |
| WO | WO-2010087231 A1 | * | 8/2010 | H01S 5/187 |
| WO | 2012-106814 A1 | | 8/2012 | |
| WO | WO-2018062252 A1 | * | 4/2018 | H01L 33/04 |
| WO | WO-2018122517 A1 | * | 7/2018 | H01L 27/142 |
| WO | 2018/221352 A1 | | 12/2018 | |
| WO | WO-2018222332 A1 | * | 12/2018 | H01L 27/124 |

* cited by examiner

LIGHT EMITTING DEVICE, PROJECTOR, AND DISPLAY

The present application is based on, and claims priority from JP Application Serial Number 2021-054824, filed Mar. 29, 2021, the disclosure of which is hereby incorporated by reference herein in its entirety.

BACKGROUND

1. Technical Field

The present disclosure relates to a light emitting device, a projector, and a display.

2. Related Art

Semiconductor lasers are promising as high-luminance next-generation light sources. In particular, a semiconductor laser to which nano-columns are applied is expected to be able to realize narrow-radiation angle high-power light emission due to an effect of a photonic crystal derived from the nano-columns.

In, for example, JP-A-2010-135858 (Document 1), there is described a method of manufacturing a semiconductor light emitting element configured including a plurality of nano-columns. According to Document 1, a part of an area where the plurality of nano-columns is formed is etched to be dug until an n-type GaN layer is reached, and then an n-type electrode is formed in the area thus dug using an evaporation process. Between the nano-columns adjacent to each other, there is disposed an SOG embedded layer.

However, when etching the area where the plurality of nano-columns is formed, an asperity is formed on the surface of the n-type GaN layer due to a difference in etching rate between the nano-columns and the SOG embedded layer. When the asperity is formed on the surface of the n-type GaN layer, a concavo-convex shape is also formed on a surface of the n-type electrode formed thereon. When bonding a bonding wire to the n-type electrode the surface of which is provided with the asperity, the bonding strength of the wire bonding decreases.

SUMMARY

A light emitting device according to an aspect of the present disclosure includes a substrate, a laminated structure provided to the substrate, and including a plurality of columnar parts, a first electrode and a second electrode configured to inject an electrical current into the plurality of columnar parts, a first wiring layer electrically connected to the first electrode, and an insulating layer configured to cover the laminated structure and the first electrode, wherein each of the columnar parts includes a first semiconductor layer of a first conductivity type, a second semiconductor layer of a second conductivity type different from the first conductivity type, and a light emitting layer disposed between the first semiconductor layer and the second semiconductor layer, the first semiconductor layer is disposed between the substrate and the light emitting layer, the laminated structure has a third semiconductor layer of the first conductivity type disposed between the substrate and the plurality of columnar parts, the first electrode is electrically connected to the first semiconductor layer via the third semiconductor layer, a contact hole is disposed in the insulating layer at a position overlapping the first electrode when viewed from a stacking direction of the first semiconductor layer and the light emitting layer, the first wiring layer is provided to the insulating layer, and the first wiring layer is electrically connected to the first electrode via the contact hole.

A projector according to another aspect of the present disclosure includes the light emitting device according to the above aspect.

A display according to another aspect of the present disclosure includes the light emitting device according to the above aspect.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

1.1.1. Overall Configuration

Figure 1:
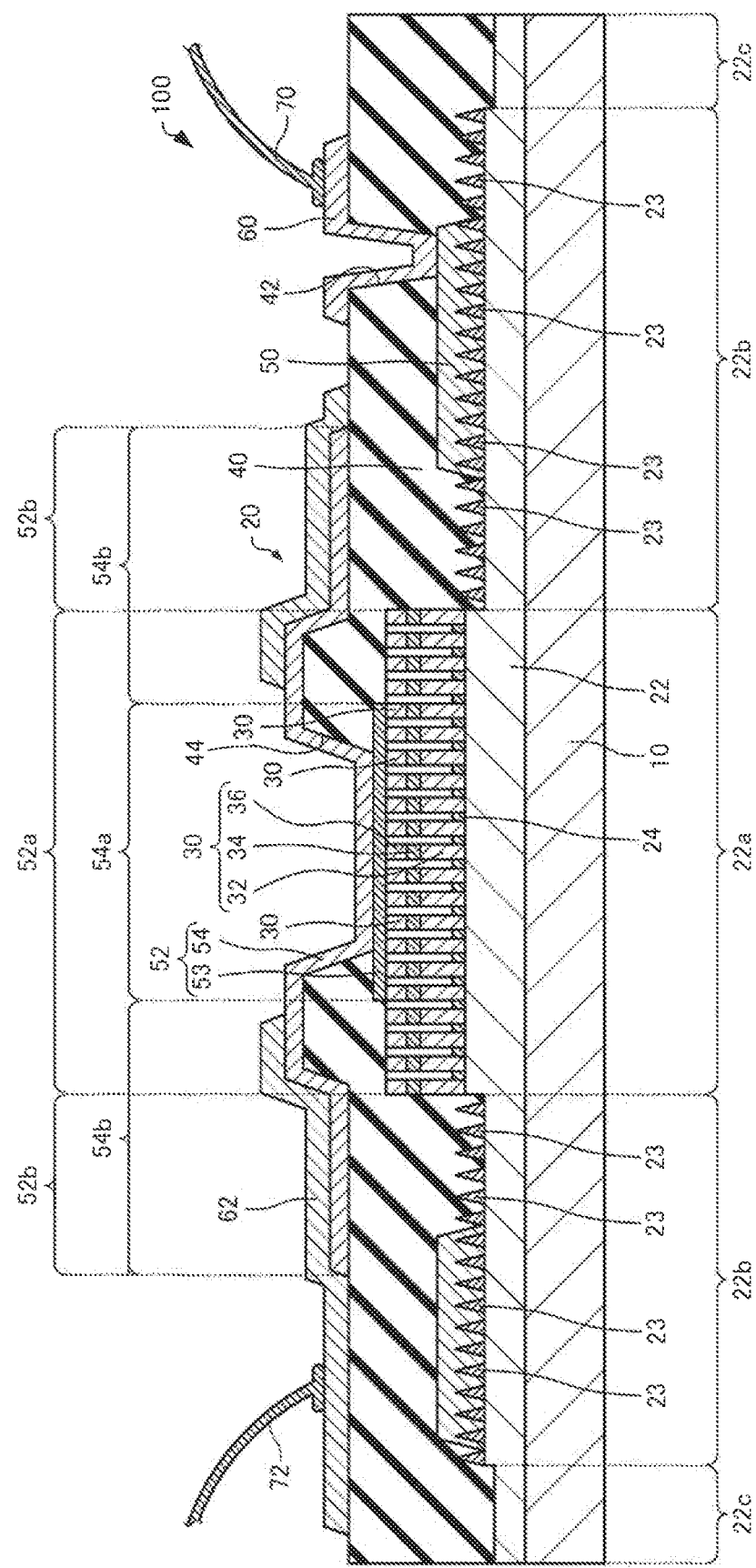
FIG. 1 is a cross-sectional view schematically showing a light emitting device according to a first embodiment.
Figure 2:
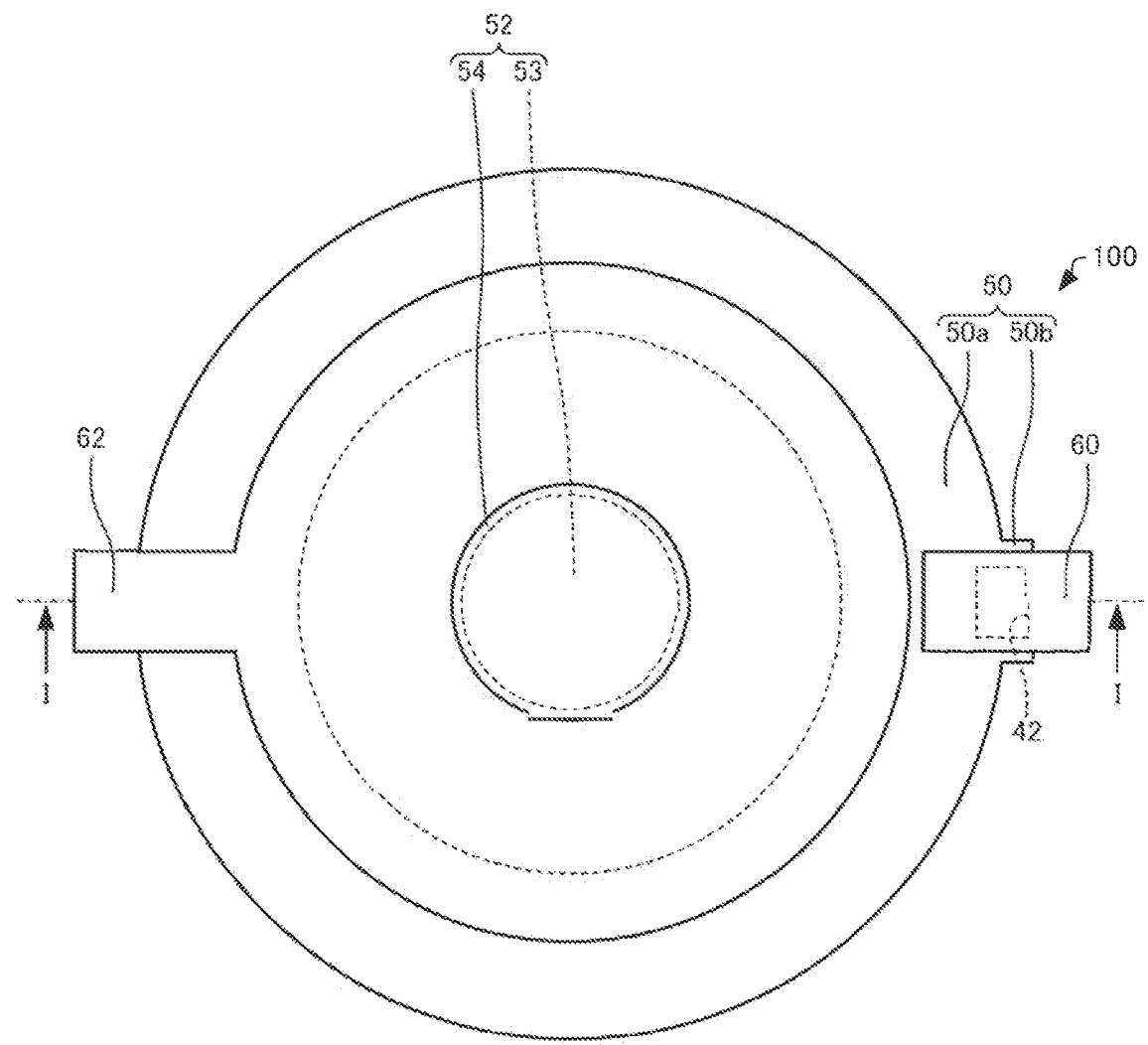
FIG. 2 is a plan view schematically showing the light emitting device according to the first embodiment.

First, a light emitting device according to a first embodiment will be described with reference to the drawings. FIG. 1 is a cross-sectional view schematically showing the light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

As shown in FIG. 1 and FIG. 2, the light emitting device 100 has, for example, a substrate 10, a laminated structure 20, an insulating layer 40, a first electrode 50, a second electrode 52, a first wiring layer 60, and a second wiring layer 62. It should be noted that in FIG. 2, the illustration of members other than the electrodes 50, 52 and the wiring layers 60, 62 is omitted for the sake of convenience. The light emitting device 100 is, for example, a semiconductor laser.

The substrate 10 is, for example, an Si substrate, a GaN substrate, a sapphire substrate, or an SiC substrate.

The laminated structure 20 is provided to the substrate 10. In the example shown in FIG. 1, the laminated structure 20 is disposed on the substrate 10. The laminated structure 20 has, for example, a buffer layer 22 as a third semiconductor layer, and columnar parts 30.

In the present specification, when taking a light emitting layer 34 as a reference in a stacking direction of the laminated structure 20 (hereinafter also referred to simply as a "stacking direction"), the description will be presented assuming a direction from the light emitting layer 34 toward a second semiconductor layer 36 as an "upward direction," and a direction from the light emitting layer 34 toward a first semiconductor layer 32 as a "downward direction." Further, a direction perpendicular to the stacking direction is also referred to as an "in-plane direction." Further, the "stacking direction of the laminated structure 20" means a stacking direction of the first semiconductor layer 32 and the light emitting layer 34 in the columnar part 30.

The buffer layer 22 is disposed on the substrate 10. The buffer layer 22 is a semiconductor layer of a first conductivity type. The buffer layer 22 is, for example, an Si-doped n-type GaN layer. On the buffer layer 22, there is disposed a mask layer 24 for forming the columnar parts 30. The mask layer 24 is, for example, a silicon oxide layer, a titanium layer, a titanium oxide layer, or an aluminum oxide layer.

The columnar parts 30 are disposed on the buffer layer 22. The columnar parts 30 each have a columnar shape protruding upward from the buffer layer 22. In other words, the columnar parts 30 protrude upward from the substrate 10 via the buffer layer 22. The columnar part 30 is also called, for example, a nano-column, a nano-wire, a nano-rod, or a nano-pillar. The planar shape of the columnar part 30 is, for example, a polygon or a circle.

The diametrical size of the columnar part 30 is, for example, no smaller than 50 nm and no larger than 500 nm. By setting the diametrical size of the columnar part 30 to be no larger than 500 nm, it is possible to obtain the light emitting layer 34 made of crystal high in quality, and at the same time, it is possible to reduce a distortion inherent in the light emitting layer 34. Thus, it is possible to amplify light generated in the light emitting layer 34 with high efficiency.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part is the diameter of a minimum circle including the polygonal shape inside, and when the planar shape of the columnar part 30 is an ellipse, the diametrical size of the columnar part 85 is the diameter of a minimum circle including the ellipse inside.

The number of the columnar parts 30 disposed is two or more. An interval between the columnar parts 30 adjacent to each other is, for example, no smaller than 1 nm and no larger than 500 nm. The plurality of columnar parts 30 is arranged at a predetermined pitch in a predetermined direction when viewed from the stacking direction. The plurality of columnar parts 30 is arranged so as to form, for example, a triangular lattice or a square lattice. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 85 is the center of a minimum circle including the ellipse inside.

The columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is the semiconductor layer of the first conductivity type. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layer 36. The light emitting layer 34 generates light in response to injection of an electrical current. The light emitting layer 34 has, for example, well layers and barrier layers. The well layers and the barrier layers are each an i-type semiconductor layer which is not intentionally doped with any impurity. The well layers are each, for example, an InGaN layer. The barrier layers are each, for example, a GaN layer. The light emitting layer 34 has an MQW (Multiple Quantum Well) structure constituted by the well layers and the barrier layers.

It should be noted that the number of the well layers and the barrier layers constituting the light emitting layer 34 is not particularly limited. For example, the number of the well layers disposed can be one, and in this case, the light emitting layer 34 has an SQW (Single Quantum Well) structure.

The second semiconductor layer 36 is disposed on the light emitting layer 34. The second semiconductor layer 36 is a semiconductor layer of a second conductivity type different from the first conductivity type. The second semiconductor layer 36 is, for example, an Mg-doped p-type GaN layer. The first semiconductor layer 32 and the second semiconductor layer 36 are cladding layers having a function of confining the light in the light emitting layer 34.

It should be noted that although not shown in the drawings, an OCL (Optical Confinement Layer) consisting of an i-type InGa layer and a GaN layer can be disposed at least one of between the first semiconductor layer 32 and the light emitting layer 34 and between the light emitting layer 34 and the second semiconductor layer 36. Further, the second semiconductor layer 36 can be provided with an EBL (Electron Blocking Layer) made of a p-type AlGaN layer.

In the light emitting device 100, a pin diode is constituted by the second semiconductor layer 36 of the p-type, the light emitting layer 34 of the i-type, and the first semiconductor layer 32 of the n-type. In the light emitting device 100, when a forward bias voltage of the pin diode is applied between the first electrode 50 and the second electrode 52, an electrical current is injected into the light emitting layer 34, and recombination of electrons and holes occurs in the light emitting layer 34. The recombination causes light emission. The light generated in the light emitting layer 34 propagates in an in-plane direction to form a standing wave due to the effect of the photonic crystal caused by the plurality of columnar parts 30, and is then gained by the light emitting layer 34 to cause laser oscillation. Then, the light emitting device 100 emits positive first-order diffracted light and negative first-order diffracted light as a laser beam in the stacking direction.

It should be noted that it is also possible to dispose a reflecting layer between the substrate 10 and the buffer layer 22, or below the substrate 10 although not shown in the drawings. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 52 side.

The insulating layer 40 covers the laminated structure 20 and the first electrode 50. In the illustrated example, the insulating layer 40 covers a part of the buffer layer 22, some of the columnar parts 30, a part of the first electrode 50, and a part of the second electrode 52. A first contact hole 42 is disposed in the insulating layer 40 at a position overlapping the first electrode 50 when viewed from the stacking direction. A second contact hole 44 is disposed in the insulating layer 40 at a position overlapping a first layer 53 of the second electrode 52 when viewed from the stacking direction. The thickness of the insulating layer 40 is, for example, no smaller than 1 µm. The insulating layer 40 is, for example, a polyimide layer or a silicon oxide layer.

The first electrode 50 is disposed on the buffer layer 22. It is also possible for the buffer layer 22 to have ohmic contact with the first electrode 50. The first electrode 50 is electrically connected to the first semiconductor layer 32. In the illustrated example, the first electrode 50 is electrically connected to the first semiconductor layer 32 via the buffer layer 22. The first electrode 50 is one of electrodes for injecting the electrical current into the light emitting layer 34.

The second electrode 52 is disposed on the second semiconductor layer 36. The second electrode 52 is electrically connected to the second semiconductor layer 36. It is also possible for the second semiconductor layer 36 to have ohmic contact with the second electrode 52. The second electrode 52 is the other of the electrodes for injecting the electrical current into the light emitting layer 34. The details of the first electrode 50 and the second electrode 52 will be described later.

The first wiring layer 60 is electrically connected to the first electrode 50. In the illustrated example, the first wiring layer 60 is connected to the first electrode 50. The second wiring layer 62 is connected to the second electrode 52. The details of the first wiring layer 60 and the second wiring layer 62 will be described later.

It should be noted that although the light emitting layer 34 of the InGaN type is described above, as the light emitting layer 34, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

Further, although it is assumed in the above description that an air gap is disposed between the columnar parts 30 adjacent to each other, it is possible for a light propagation layer for propagating the light generated in the light emitting layer 34 to be disposed between the columnar parts 30 adjacent to each other. The light propagation layer is, for example, a silicon oxide layer, an aluminum oxide layer, or a titanium oxide layer.

Further, the light emitting device 100 is not limited to the laser, and can also be an LED (Light Emitting Diode).

1.1.2. Buffer Layer

As shown in FIG. 1, the buffer layer 22 is disposed between the substrate 10 and the plurality of columnar parts 30. The buffer layer 22 has, for example, a columnar part formation region 22a, an electrode formation region 22b, and an outer circumferential region 22c. The regions 22a, 22b, and 22c are the upper surface of the buffer layer 22.

In the columnar part formation region 22a, there are disposed the plurality of columnar parts 30 and the mask layer 24. The columnar part formation region 22a overlaps the plurality of columnar parts 30 and the mask layer 24 when viewed from the stacking direction. In the illustrated example, the columnar part formation region 22a is a flat surface.

In the electrode formation region 22b, there is disposed the first electrode 50. The electrode formation region 22b surrounds the columnar part formation region 22a when viewed from the stacking direction. In the illustrated example, the height of the electrode formation region 22b is lower than the height of the columnar part formation region 22a. In other words, the distance between the electrode formation region 22b and the substrate 10 is shorter than the distance between the columnar part formation region 22a and the substrate 10.

In the electrode formation region 22b, there is formed a plurality of protrusions 23. The height of the protrusions 23 is, for example, no lower than 30 nm and no higher than 300 nm. It should be noted that the reason that the protrusions 23 are formed in the electrode formation region 22b and so on will be explained in "1.2. Method of Manufacturing Light Emitting Device" described later.

The outer circumferential region 22c surrounds the electrode formation region 22b when viewed from the stacking direction. In the illustrated example, the height of the outer circumferential region 22c is smaller than the height of the electrode formation region 22b. In other words, the distance between the outer circumferential region 22c and the substrate 10 is shorter than the distance between the electrode formation region 22a and the substrate 10. There is a possibility that an abnormal film not shown grows in the outer circumferential region 22c. It should be noted that the reason that the abnormal film grows in the outer circumferential region 22c and so on will be explained in "1.2. Method of Manufacturing Light Emitting Device" described later.

1.1.3. First Electrode and Second Electrode

The first electrode 50 is provided to the electrode formation region 22b and the plurality of protrusions 23. On the upper surface of the first electrode 50, the shape of the plurality of protrusions 23 is traced to form an asperity not shown.

The first electrode 50 surrounds the plurality of columnar parts 30 when viewed from the stacking direction. The first electrode 50 surrounds the columnar part formation region 22a when viewed from the stacking direction. In the example shown in FIG. 2, the first electrode 50 has a ring-like part 50a having a ring-like shape, and a contact reception part 50b for receiving the first contact hole 42. The contact reception part 50b is connected to the ring-like part 50a. The first contact hole 42 overlaps the contact reception part 50b when viewed from the stacking direction. The plurality of columnar parts 30 is disposed inside the ring-like part 50a when viewed from the stacking direction. It should be noted that although not shown in the drawings, it is possible for the first electrode 50 to have a shape obtained by providing a cutout to the ring-like part 50a when viewed from the stacking direction.

The thickness of the first electrode 50 is, for example, no smaller than 10 nm and no larger than 200 nm, and is preferably no smaller than 50 nm and no larger than 100 nm. When the thickness of the first electrode 50 is no smaller than 10 nm, it is possible to make the resistance low. When the thickness of the first electrode 50 is no larger than 200 nm, it is possible to enhance the flatness of the insulating layer 40, and thus, it is possible to reduce the possibility that the second wiring layer 62 is separated. When the thickness of the first electrode 50 is no larger than 200 nm, there rises the possibility that the asperity is provided to the upper surface of the first electrode 50.

The first electrode 50 is a laminated structure having, for example, a Cr layer and an Ni layer stacked from the buffer layer 22 side. The thickness of the Cr layer is, for example, 20 nm. The thickness of the Ni layer is, for example, 50 nm.

As shown in FIG. 1, the second electrode 52 is disposed at the opposite side to the substrate 10 of the laminated structure 20. The second electrode 52 has a first portion 52a and a second portion 52b. The first portion 52a is a portion overlapping the columnar part formation region 22a when viewed from the stacking direction. The second portion 52b is a portion which does not overlap the columnar part formation region 22a when viewed from the stacking direction. The second portion 52b overlaps, for example, the electrode formation region 22b when viewed from the stacking direction. The second portion 52b surrounds the first portion 52a when viewed from the stacking direction. The second portion 52b is connected to the first portion 52a. The first electrode 50 overlaps the second portion 52b when viewed from the stacking direction. In other words, the first electrode 50 overlaps the second electrode 52 when viewed from the stacking direction. A part of the first electrode 50 is disposed so as to overlap the second electrode 52 when viewed from the stacking direction. Further, the first electrode 50 overlaps the second wiring layer 62 when viewed from the stacking direction. A part of the first electrode 50 is disposed so as to overlap the second wiring layer 62 when viewed from the stacking direction.

The second electrode 52 has a first layer 53 and a second layer 54. The first layer 53 is disposed between the columnar parts 30 and the second layer 54. The first layer 53 is disposed on the plurality of columnar parts 30 and on gaps between the columnar parts 30 adjacent to each other. The first layer 53 has contact with the second semiconductor layer 36 of each of the columnar parts 30. It is possible for the second semiconductor layer 36 to have ohmic contact with the first layer 53. The planar shape of the first layer 53 is, for example, a circle.

The electrical resistivity of the first layer 53 is lower than the electrical resistivity of the second layer 54. The thickness of the first layer 53 is, for example, no smaller than 5 nm and no larger than 50 nm, and is preferably no smaller than 10 nm and no larger than 30 nm. When the thickness of the first layer 53 is no smaller than 5 nm, it is possible to make the resistance low. When the thickness of the first layer 53 is no larger than 50 nm, the transmittance with respect to the light generated in the light emitting layer 34 can be made high.

The first layer 53 is a laminated structure having, for example, a Pd layer, a Pt layer, and an Au layer stacked from the second semiconductor layer 36 side. The thickness of the Pd layer is, for example, 5 nm. The thickness of the Pt layer is, for example, 5 nm. The thickness of the Au layer is, for example, 10 nm. It should be noted that the first layer 53 can be a laminated structure having an Ni layer and an Au layer stacked from the second semiconductor layer 36 side.

The second layer 54 is disposed on the first layer 53 and the insulating layer 40. The second layer 54 is provided to the second contact hole 44. The second layer 54 is disposed on the upper surface of the insulating layer 40 and a side surface of the insulating layer 40 defining the second contact hole 44. The second layer 54 is connected to the first layer 53 exposed by the second contact hole 44. The planar shape of the second layer 54 is, for example, a circle.

The transmittance of the second layer 54 with respect to the light generated in the light emitting layer 34 is higher than the transmittance of the first layer 53 with respect to the light generated in the light emitting layer 34. The second layer 54 is, for example, transparent with respect to the light generated in light emitting layer 34. The thickness of the second layer 54 is, for example, no smaller than 100 nm and no larger than 500 nm, and is preferably no smaller than 250 nm and no larger than 350 nm. When the thickness of the second layer 54 is no smaller than 100 nm, it is possible to make the resistance low. When the thickness of the second layer 54 is no larger than 500 nm, the transmittance with respect to the light generated in the light emitting layer 34 can be made high. The material of the second layer 54 is, for example, ITO (Indium Tin Oxide) or IZO (Indium Zinc Oxide).

The second layer 54 has a third portion 54a and a fourth portion 54b. The third portion 54a is a portion overlapping the first layer 53 when viewed from the stacking direction. The fourth portion 54b is a portion which does not overlap the first layer 53 when viewed from the stacking direction. The fourth portion 54b surrounds the third portion 54a when viewed from the stacking direction. The fourth portion 54b is connected to the third portion 54a.

1.1.4. First Wiring Layer and Second Wiring Layer

The first wiring layer 60 is connected to the first electrode 50. The first wiring layer 60 is disposed on the first electrode 50, on the insulating layer 40, and in the first contact hole 42. The first wiring layer 60 is disposed on the upper surface of the first electrode 50, the upper surface of the insulating layer 40, and a side surface of the insulating layer 40 defining the first contact hole 42. The first wiring layer 60 is connected to the first electrode 50 exposed by the first contact hole 42. It should be noted that the first wiring layer 60 is disposed on the first electrode 50 and in the first contact hole 42 in the present embodiment, but this is not a limitation, and it is possible to adopt a configuration in which a contact plug having electrical conductivity is provided to the first contact hole 42, and the first wiring layer 60 is disposed on the first electrode 50, on the insulating layer 40, and on the contact plug. In this case, the first wiring layer 60 is connected to the contact plug, and is electrically connected to the first electrode 50 via the contact plug. The contact plug can be formed of the same material as that of the first wiring layer, or can be formed of a different material therefrom. The contact plug can be formed of, for example, tungsten (W) or titanium (Ti).

It should be noted that the first wiring layer 60 is disposed on the first electrode 50 and in the first contact hole 42 in the present embodiment, but this is not a limitation, and it is possible to adopt a configuration in which a contact plug having electrical conductivity is provided to the first contact hole 42, and the first wiring layer 60 is disposed on the first electrode 50, on the insulating layer 40, and on the contact plug. In this case, the first wiring layer 60 is connected to the contact plug, and is electrically connected to the first electrode 50 via the contact plug. The contact plug can be formed of the same material as that of the first wiring layer, or can be formed of a different material therefrom. The contact plug can be formed of, for example, tungsten (W) or titanium (Ti).

The first wiring layer 60 is a laminated structure having, for example, a Cr layer, an Ni layer, and an Au layer stacked from the insulating layer 40 side. The thickness of the Cr layer is, for example, 20 nm. The thickness of the Ni layer is, for example, 30 nm. The thickness of the Au layer is, for example, 200 nm. As shown in FIG. 1, a first bonding wire 70 is bonded to a portion of the first wiring layer 60 located on the insulating layer 40. In the illustrated example, an upper surface of the portion of the first wiring layer 60 located on the insulating layer 40 is a flat surface. It should be noted that although not shown in the drawings, it is possible to use an FPC (Flexible Printed Circuit) instead of the first bonding wire 70.

The second wiring layer 62 is connected to the second electrode 52. In the illustrated example, the second wiring layer 62 is connected to the second layer 54 of the second electrode 52. The second wiring layer 62 is disposed on the second layer 54 and on the insulating layer 40. The second wiring layer 62 is connected to the fourth portion 54*b* of the second layer 54. The second wiring layer 62 surrounds the first layer 53 of the second electrode 52 when viewed from the stacking direction.

The material of the second wiring layer 62 is, for example, the same as the material of the first wiring layer 60. As shown in FIG. 1, a second bonding wire 72 is bonded to a portion of the second wiring layer 62 located on the insulating layer 40. In the illustrated example, an upper surface of the portion of the second wiring layer 62 located on the insulating layer 40 is a flat surface. It should be noted that although not shown in the drawings, it is possible to use an FPC instead of the second bonding wire 72.

1.2. Method of Manufacturing Light Emitting Device

Then, a method of manufacturing the light emitting device 100 according to the first embodiment will be described with reference to the drawings. FIG. 3 through FIG. 6 are cross-sectional views schematically showing a manufacturing process of the light emitting device 100 according to the first embodiment.

Figure 3:
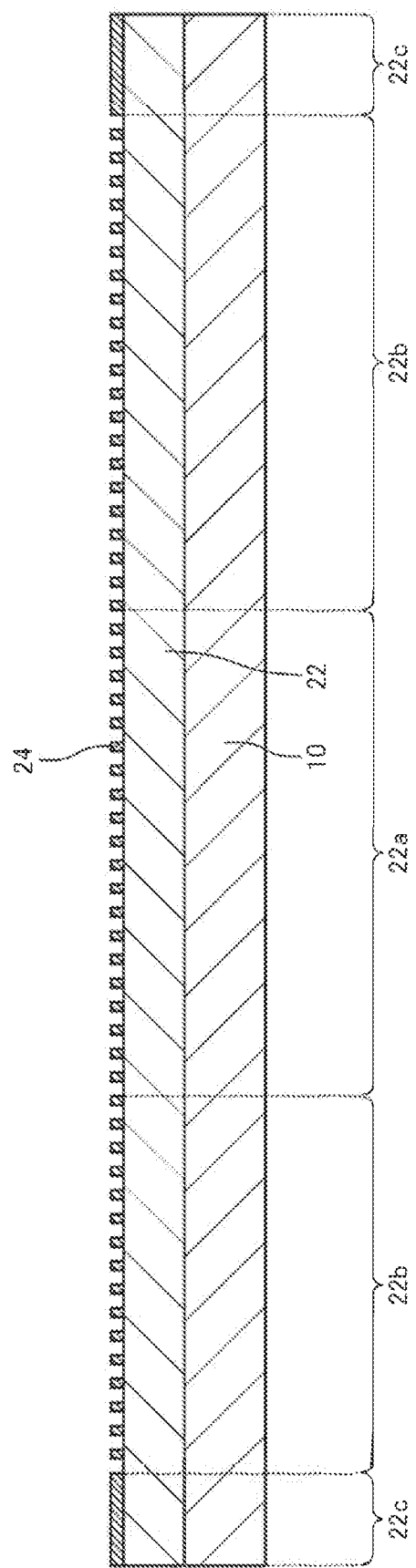
FIG. 3 is a cross-sectional view schematically showing a manufacturing process of the light emitting device according to the first embodiment.

As shown in FIG. 3, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the mask layer 24 is formed on the buffer layer 22. The mask layer 24 is formed in the columnar part formation region 22*a*, the electrode formation region 22*b*, and the outer circumferential region 22*c* of the buffer layer 22. The mask layer 24 is formed by deposition using, for example, an electron beam evaporation method or a sputtering method, and patterning. The patterning process is performed using a photolithography process and an etching process.

Figure 4:
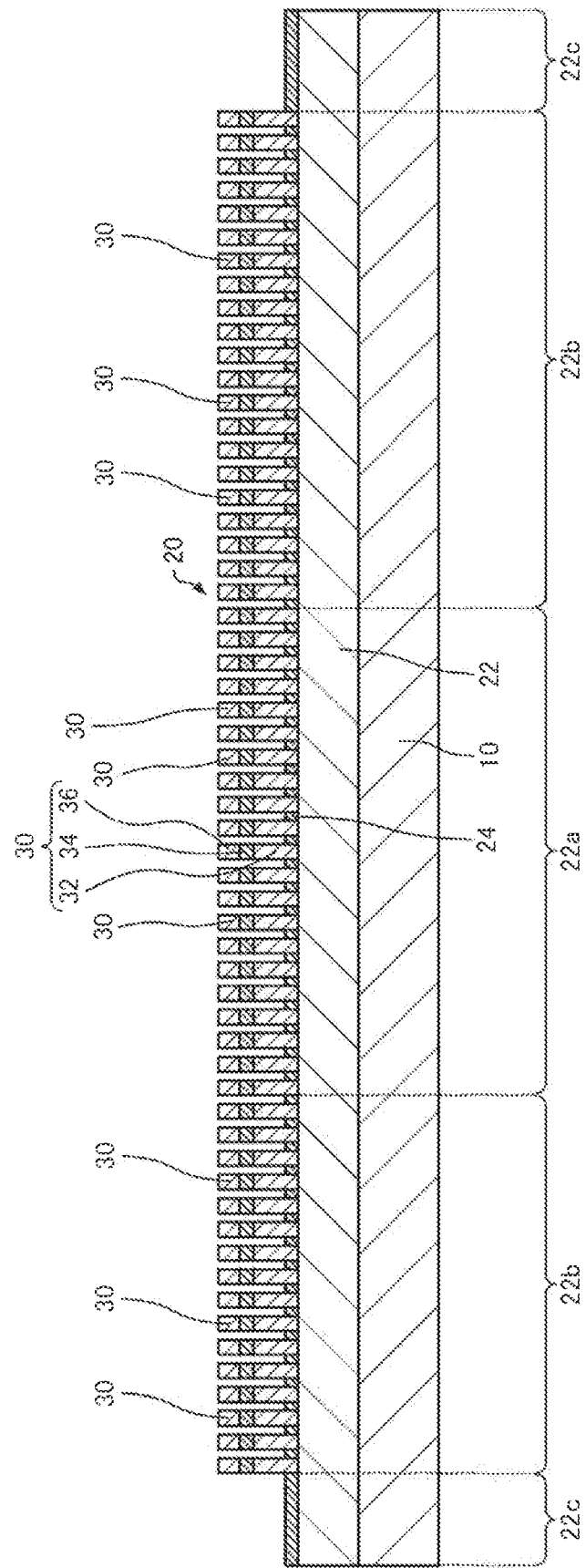
FIG. 4 is a cross-sectional view schematically showing the manufacturing process of the light emitting device according to the first embodiment.

As shown in FIG. 4, the first semiconductor layer 32, the light emitting layer 34, and the second semiconductor layer 36 are grown epitaxially in this order on the buffer layer 22 using the mask layer 24 as a mask. As the method of achieving the epitaxial growth, there can be cited, for example, the MOCVD method and the MBE method. Due to the present step, it is possible to form the plurality of columnar parts 30. The plurality of columnar parts 30 is formed in the columnar part formation region 22*a* and the electrode formation region 22*b*.

In the present step, there is a possibility that a film grown abnormally is formed on the mask layer 24 formed in the outer circumferential region 22*c* of the buffer layer 22 although not shown in the drawings. For example, when an impurity is attached on the mask layer 24, an unintended film grows nucleating the impurity during the epitaxial growth. Since an opening part for growing the columnar part 30 is not provided to the mask layer 24 formed in the outer circumferential region 22*c*, the impurity is apt to remain on the mask layer 24. Since there is a possibility that the film grown abnormally is formed on the mask layer 24 formed in the outer circumferential region 22*c* as described above, it is not preferable to form the first electrode 50 in the outer circumferential region 22*c*.

Figure 5:
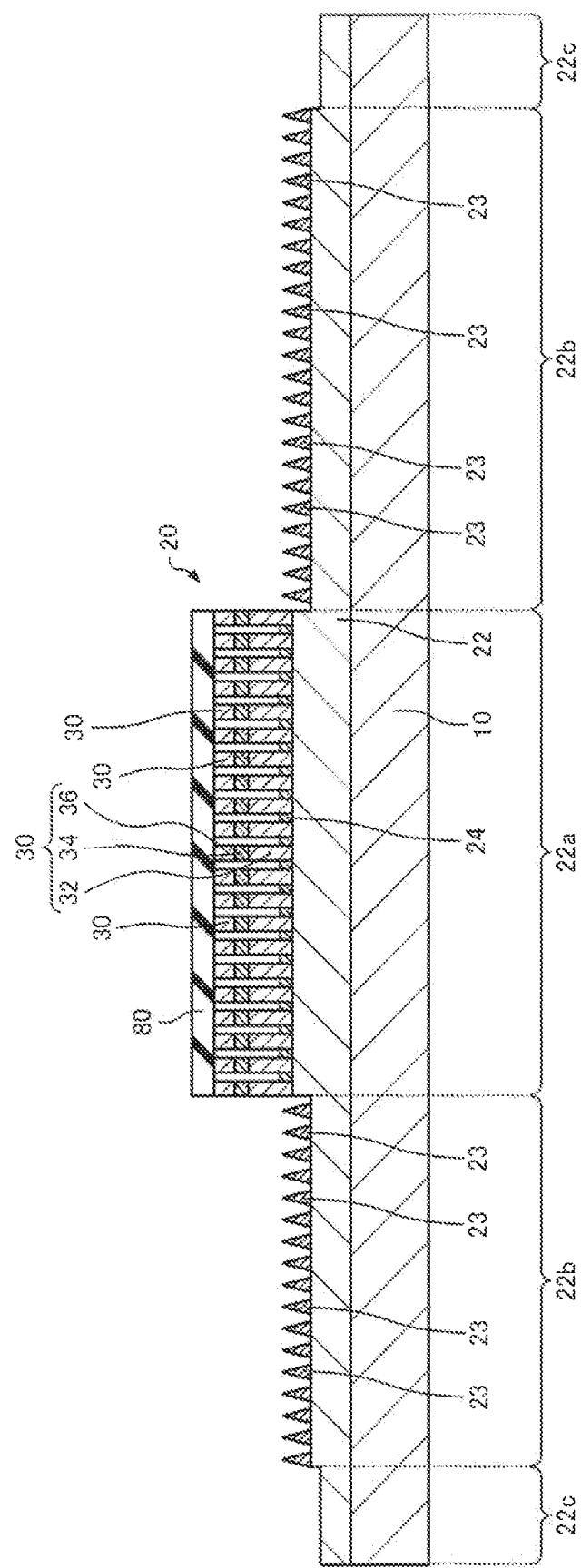
FIG. 5 is a cross-sectional view schematically showing the manufacturing process of the light emitting device according to the first embodiment.

As shown in FIG. 5, a mask layer 80 having a predetermined shape is formed on the plurality of columnar parts 30. The mask layer 80 is, for example, a resist layer or a silicon oxide layer. When viewed from the stacking direction, the mask layer 80 overlaps the columnar part formation region 22*a*.

Then, etching is performed on the columnar parts 30 which are not covered with the mask layer 80 using the mask layer 80 as a mask. The etching is, for example, dry etching. Due to the etching, the columnar parts 30 which are not covered with the mask layer 80 decrease in size, but the protrusions 23 remain. The plurality of protrusions 23 can be formed only of the buffer layer 22, or can also be formed of the buffer layer 22 and the first semiconductor layer 32.

The plurality of protrusions 23 is obtained by shrinking the plurality of columnar parts 30, and is therefore regularly arranged when viewed from the stacking direction. Therefore, when forming the first electrode 50, the first electrode 50 can be formed with high uniformity throughout the entire surface of the first electrode 50. Further, by forming the first electrode 50 so as to fill in recesses between the protrusions 23 adjacent to each other, it is possible to increase the contact area between the first electrode 50 and the laminated structure 20 compared to when the protrusions 23 are not provided. Thus, it is possible to reduce the contact resistance between the first electrode 50 and the laminated structure 20.

In the etching process of the plurality of columnar parts 30, the mask layer 24 formed in the electrode formation region 22*b* and the outer circumferential region 22*c* is removed. Since the columnar part 30 is not formed in the outer circumferential region 22*c*, the height of the outer circumferential region 22*c* becomes lower than, for example, the height of the columnar part formation region 22*a* and the height of the electrode formation region 22*b*.

Figure 6:
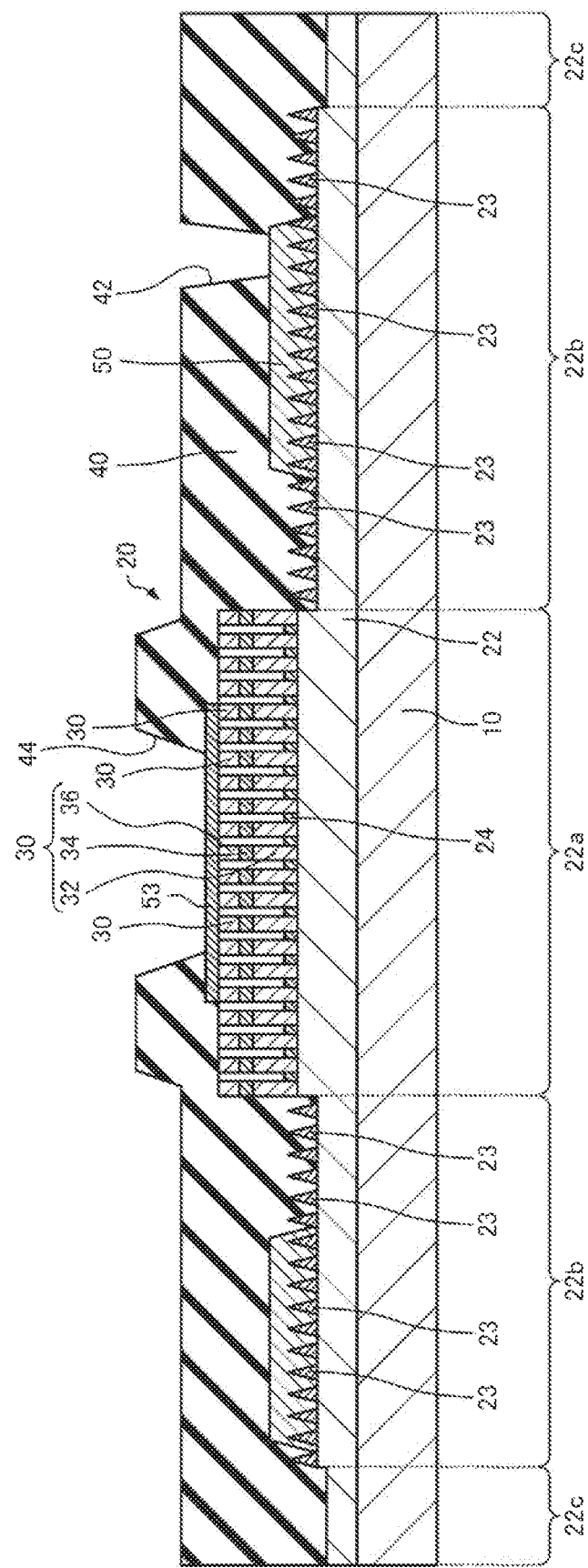
FIG. 6 is a cross-sectional view schematically showing the manufacturing process of the light emitting device according to the first embodiment.

As shown in FIG. 6, after removing the mask layer 80, the first layer 53 of the second electrode 52 is formed on the plurality of columnar parts 30, and the first electrode 50 is formed in the electrode formation region 22*b* and on the plurality of protrusions 23. The first layer 53 and the first electrode 50 are formed using, for example, a CVD (Chemical Vapor Deposition) method, a sputtering method, or a vacuum evaporation method. It should be noted that the order of the formation of the first layer 53 and the formation of the first electrode 50 is not particularly limited.

Then, the insulating layer 40 is formed so as to cover the laminated structure 20, the first electrode 50, and the first layer 53. The insulating layer 40 is formed using, for example, a spin-coating method or the CVD method.

Then, patterning is performed on the insulating layer 40 to thereby form the first contact hole 42 and the second contact hole 44. The patterning is realized by, for example, photolithography and etching. The first contact hole 42 and the second contact hole 44 can be formed in the same step, or can also be formed in separate steps.

As shown in FIG. 1, the second layer 54 is formed on the first layer 53 and the insulating layer 40. The second layer 54 is formed using, for example, the CVD method, the sputtering method, or the vacuum evaporation method. According to the present step, it is possible to form the second electrode 52.

Then, the first wiring layer 60 is formed on the first electrode 50 and on the insulating layer 40, and the second wiring layer 62 is formed on the second electrode 52 and the insulating layer 40. The first wiring layer 60 and the second wiring layer 62 are formed using, for example, the CVD method or the sputtering method. The first wiring layer 60 and the second wiring layer 62 can be formed in the same step, or can also be formed in separate steps.

Then, the first bonding wire 70 is bonded to the first wiring layer 60, and the second bonding wire 72 is bonded to the second wiring layer 62. The order of the bonding of the first bonding wire 70 and the bonding of the second bonding wire 72 is not particularly limited.

Due to the steps described hereinabove, it is possible to manufacture the light emitting device 100.

1.3. Functions and Advantages

In the light emitting device 100, the first electrode 50 is electrically connected to the first semiconductor layer 32 via the buffer layer 22, the first contact hole 42 is disposed in the insulating layer 40 at the position overlapping the first electrode 50 when viewed from the stacking direction, the first wiring layer 60 is disposed on the insulating layer 40, and the first wiring layer 60 is electrically connected to the first electrode 50 via the first contact hole 42. Therefore, in the light emitting device 100, it is possible to bond an external terminal such as the first bonding wire 70 to the portion of the first wiring layer 60 located on the insulating layer 40. Thus, it is possible to increase the bonding strength with the external terminal compared to when directly bonding the external terminal to the first electrode.

As described above, since the first electrode 50 is formed on the plurality of protrusions 23, the asperity is formed on the upper surface of the first electrode 50. When bonding the bonding wire to the first electrode 50 provided with the asperity, the bonding wire fails to fill in the recesses of the asperity, and thus, the contact area between the first electrode 50 and the bonding wire decreases. Therefore, the bonding strength with the bonding wire decreases.

In the light emitting device 100, the second electrode 52 is disposed at the opposite side of the laminated structure 20 to the substrate 10, the plurality of columnar parts 30 is disposed in the columnar part formation region 22a of the buffer layer 22, the second electrode 52 has the first portion 52a overlapping the columnar part formation region 22a when viewed from the stacking direction, and the second portion 52b which does not overlap the columnar part formation region 22a, and which surrounds the first portion 52a, and the first electrode 50 overlaps the second portion 52b when viewed from the stacking direction. Therefore, in the light emitting device 100, it is possible to reduce the distance between the first electrode 50 and the columnar part formation region 22a compared to when the first electrode does not overlap the second portion when viewed from the stacking direction. Thus, it is possible to efficiently inject the electrical current into the plurality of columnar parts 30.

When the distance between the first electrode and the columnar part formation region is long, it is difficult to efficiently inject the electrical current since the buffer layer is higher in electrical resistivity than the first electrode.

In the light emitting device 100, the first electrode 50 surrounds the plurality of columnar parts 30 when viewed from the stacking direction. Therefore, in the light emitting device 100, it is possible to inject the electrical current into the plurality of columnar parts 30 with high uniformity compared to when the first electrode does not surround the plurality of columnar parts when viewed from the stacking direction.

In the light emitting device 100, the second electrode 52 has the first layer 53, and the second layer higher in transmittance with respect to the light generated in the light emitting layer 34 than the first layer 53, the electrical resistivity of the first layer 53 is lower than the electrical resistivity of the second layer 54, the first layer 53 has contact with the second semiconductor layer 36, and the second layer 54 is disposed on the first layer 53. Therefore, in the light emitting device 100, it is possible to increase the transmittance with respect to the light generated in the light emitting layer 34 while reducing the contact resistance between the second electrode 52 and the second semiconductor layer 36.

In the light emitting device 100, the second wiring layer 62 connected to the second electrode 52 is provided, the second layer 54 has the third portion 54a overlapping the first layer 53 when viewed from the stacking direction, and the fourth portion 54b which does not overlap the first layer 53 and which surrounds the third portion 54a, the second wiring layer 62 is connected to the fourth portion 54b, and the second wiring layer 62 surrounds the first layer 53 when viewed from the stacking direction. Therefore, in the light emitting device 100, it is possible to inject the electrical current into the first layer 53 with high uniformity compared to when the second wiring layer does not surround the first layer when viewed from the stacking direction.

2. Second Embodiment

Figure 7:
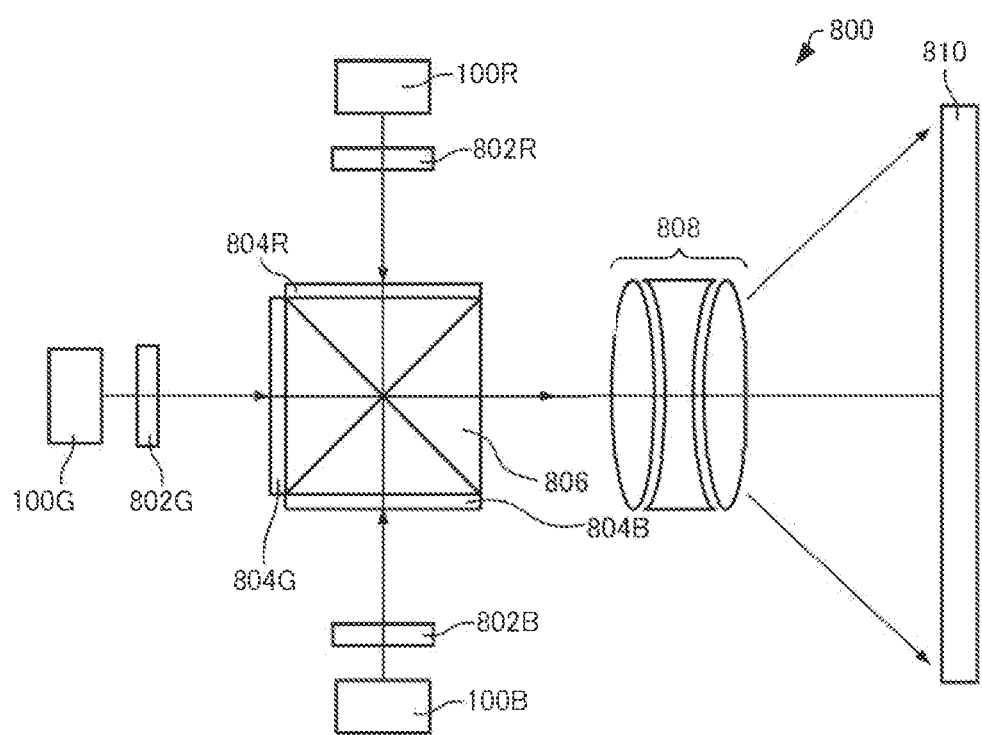
FIG. 7 is a diagram schematically showing a projector according to a second embodiment.

Then, a projector according to a second embodiment will be described with reference to the accompanying drawings. FIG. 7 is a diagram schematically showing the projector 800 according to the second embodiment.

The projector 800 has, for example, the light emitting devices 100 as light sources.

The projector 800 includes a housing not shown, a red light source 100R, a green light source 100G, and a blue light source 100B which are disposed inside the housing, and respectively emit red light, green light, and blue light. It should be noted that in FIG. 7, the red light source 100R, the green light source 100G, and the blue light source 100B are simplified for the sake of convenience.

The projector 800 further includes a first optical element 802R, a second optical element 802G, a third optical element 802B, a first light modulation device 804R, a second light modulation device 804G, a third light modulation device 804B, and a projection device 808 all installed inside the housing. The first light modulation device 804R, the second light modulation device 804G, and the third light modulation device 804B are each, for example, a transmissive liquid crystal light valve. The projection device 808 is, for example, a projection lens.

The light emitted from the red light source 100R enters the first optical element 802R. The light emitted from the red light source 100R is collected by the first optical element 802R. It should be noted that the first optical element 802R can be provided with other functions than the light collection. The same applies to the second optical element 802G and the third optical element 802B described later.

The light collected by the first optical element 802R enters the first light modulation device 804R. The first light modulation device 804R modulates the incident light in accordance with image information. Then, the projection device 808 projects an image formed by the first light modulation device 804R on a screen 810 in an enlarged manner.

The light emitted from the green light source 100G enters the second optical element 802G. The light emitted from the green light source 100G is collected by the second optical element 802G.

The light collected by the second optical element 802G enters the second light modulation device 804G. The second light modulation device 804G modulates the incident light in accordance with the image information. Then, the projection device 808 projects an image formed by the second light modulation device 804G on the screen 810 in an enlarged manner.

The light emitted from the blue light source 100B enters the third optical element 802B. The light emitted from the blue light source 100B is collected by the third optical element 802B.

The light collected by the third optical element 802B enters the third light modulation device 804B. The third light modulation device 804B modulates the incident light in accordance with the image information. Then, the projection device 808 projects an image formed by the third light modulation device 804B on the screen 810 in an enlarged manner.

Further, it is possible for the projector 800 to include a cross dichroic prism 806 for combining the light emitted from the first light modulation device 804R, the light emitted from the second light modulation device 804G, and the light emitted from the third light modulation device 804B with each other to guide the light thus combined to the projection device 808.

The three colors of light respectively modulated by the first light modulation device 804R, the second light modulation device 804G, and the third light modulation device 804B enter the cross dichroic prism 806. The cross dichroic prism 806 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 810 by the projection device 808, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 804R, the second light modulation device 804G, and the third light modulation device 804B. Then, it is also possible for the projection device 808 to project the images formed by the red light source 100R, the green light source 100G, and the blue light source 100B on the screen 810 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device which scans the surface of the screen with the light from the light source to thereby display an image with a desired size on the display surface.

3. Third Embodiment

Figure 8:
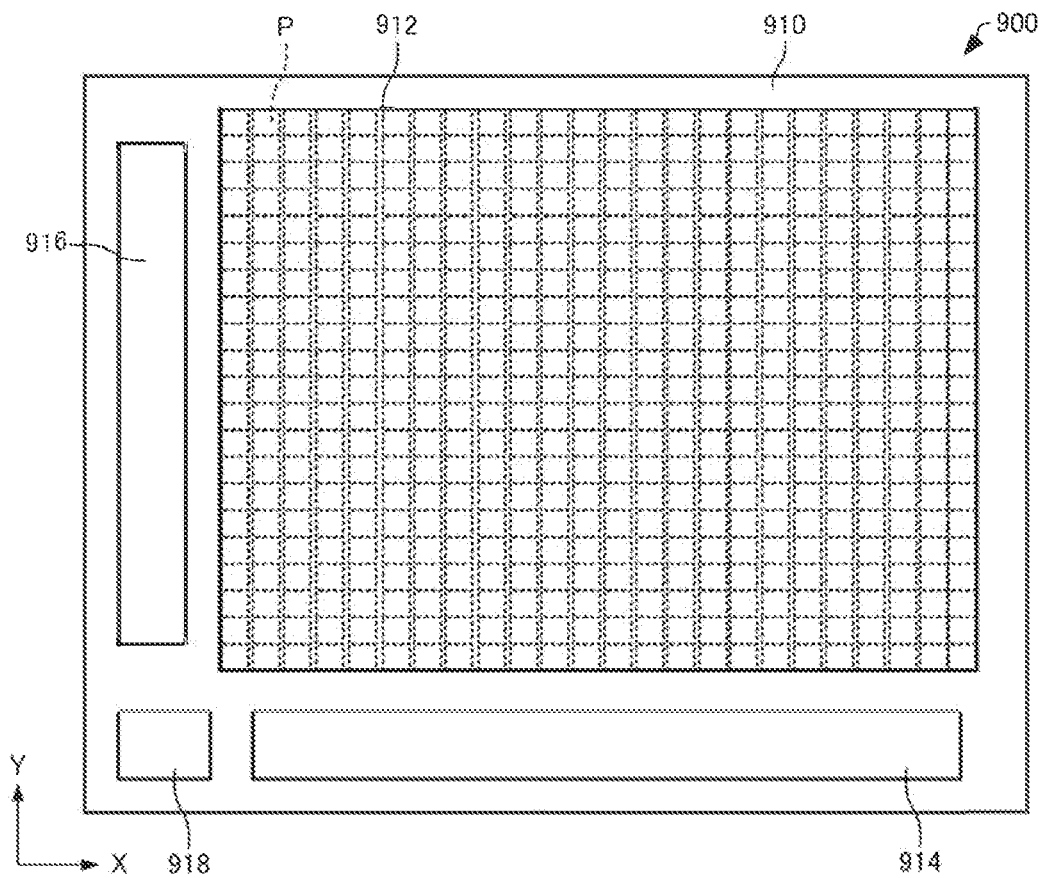
FIG. 8 is a plan view schematically showing a display according to a third embodiment.
Figure 9:
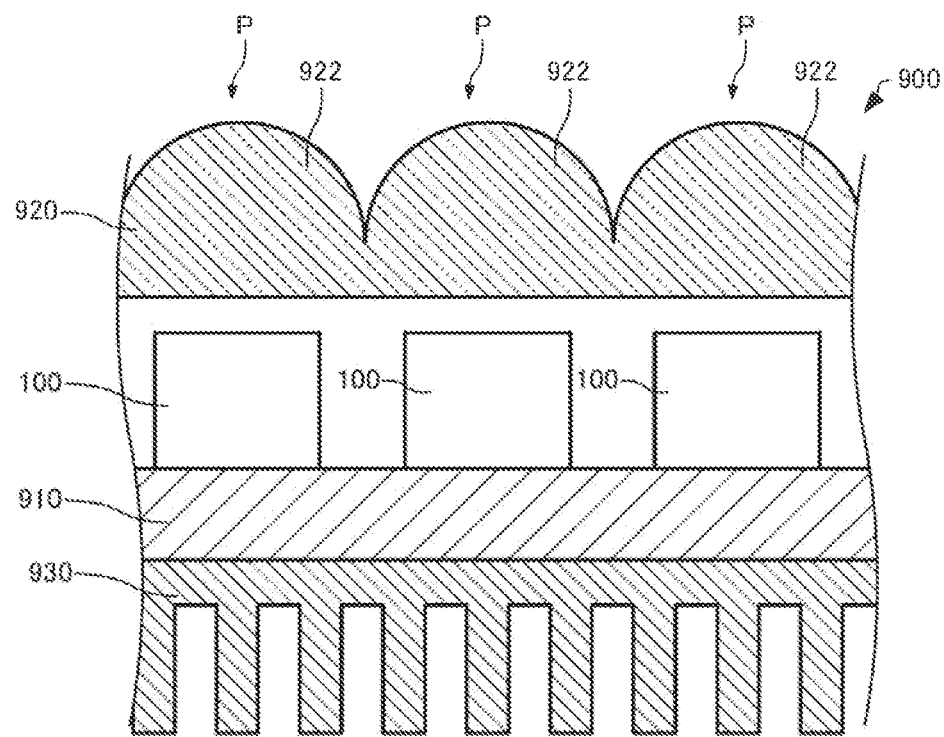
FIG. 9 is a cross-sectional view schematically showing the display according to the third embodiment.

Then, a display according to a third embodiment will be described with reference to the drawing. FIG. 8 is a plan view schematically showing the display 900 according to the third embodiment. FIG. 9 is a cross-sectional view schematically showing the display 900 according to the third embodiment. In FIG. 8, the X axis and the Y axis are illustrated as two axes perpendicular to each other for the sake of convenience.

The display 900 has, for example, the light emitting devices 100 as light sources.

The display 900 is a display device for displaying an image. The image includes what displays only character information. The display 900 is a self-luminous type display. The display 900 has a circuit board 910, a lens array 920, and a heatsink 930 as shown in FIG. 8 and FIG. 9.

On the circuit board 910, there is mounted a drive circuit for driving the light emitting devices 100. The drive circuit is a circuit including, for example, a CMOS (Complementary Metal Oxide Semiconductor). The drive circuit drives the light emitting devices 100 based on, for example, the image information input thereto. Although not shown in the drawings, on the circuit board 910, there is disposed a light transmissive substrate for protecting the circuit board 910.

The circuit board 910 has a display area 912, a data line drive circuit 914, a scanning line drive circuit 916, and a control circuit 918.

The display area 912 is formed of a plurality of pixels P. The pixels P are arranged along the X axis and the Y axis in the illustrated example.

Although not shown in the drawings, the circuit board 910 is provided with a plurality of scanning lines and a plurality of data lines. For example, the scanning lines extend along the X axis, and the data lines extend along the Y axis. The scanning lines are connected to the scanning line drive circuit 916. The data lines are connected to the data line drive circuit 914. The pixels P are disposed so as to correspond to the respective intersections between the scanning lines and the data lines.

Each of the pixels P has, for example, one of the light emitting devices 100, a single lens 922, and a pixel circuit not shown. The pixel circuit includes a switching transistor functioning as a switch for the pixel P, wherein the gate of the switching transistor is connected to the scanning line, and one of the source and the drain thereof is connected to the data line.

The data line drive circuit 914 and the scanning line drive circuit 916 are circuits for controlling the drive of the light emitting devices 100 respectively constituting the pixels P. The control circuit 918 controls the display of the image.

The control circuit 918 is supplied with image data from a higher-level circuit. The control circuit 918 supplies a variety of signals based on the image data to the data line drive circuit 914 and the scanning line drive circuit 916.

When the scanning line drive circuit 916 activates a scanning signal to thereby select the scanning line, the switching transistor of the pixel P thus selected is set to an ON state. On this occasion, by the data line drive circuit 914 supplying the pixel P thus selected with the data signal from the data line, the light emitting device 100 of the pixel P thus selected emits light in accordance with the data signal.

The lens array 920 has a plurality of lenses 922. The lenses 922 are disposed, for example, so as to correspond one-to-one to the light emitting devices 100. The light emitted from the light emitting device 100 enters corresponding one of the lenses 922.

The heatsink 930 has contact with the circuit board 910. The material of the heatsink 930 is metal such as copper or aluminum. The heatsink 930 releases heat generated in the light emitting devices 100.

The light emitting device according to the embodiment described above can also be used for other devices than the projector and the display. As the applications other than the projector and the display, there can be cited a light source of, for example, indoor and outdoor illumination, a laser printer, a scanner, an in-car light, sensing equipment using light, or communication equipment.

The present disclosure includes configurations substantially the same as the configurations described as the embodiments such as configurations having the same function, the same way, and the same result, or configurations having the same object and the same advantage. Further, the present disclosure includes configurations obtained by replacing a non-essential part of the configurations described as the embodiments. Further, the present disclosure includes configurations providing the same functions and advantages, and configurations capable of achieving the same object as those of the configurations described as the embodiments. Further, the present disclosure includes configurations obtained by adding a known technology to the configurations described as the embodiments.

The following contents derive from the embodiments and the modified examples described above.

A light emitting device according to an aspect includes a substrate, a laminated structure provided to the substrate, and including a plurality of columnar parts, a first electrode and a second electrode configured to inject an electrical current into the plurality of columnar parts, a first wiring layer electrically connected to the first electrode, and an insulating layer configured to cover the laminated structure and the first electrode, wherein each of the columnar parts includes a first semiconductor layer of a first conductivity type, a second semiconductor layer of a second conductivity type different from the first conductivity type, and a light emitting layer disposed between the first semiconductor layer and the second semiconductor layer, the first semiconductor layer is disposed between the substrate and the light emitting layer, the laminated structure has a third semiconductor layer of the first conductivity type disposed between the substrate and the plurality of columnar parts, the first electrode is electrically connected to the first semiconductor layer via the third semiconductor layer, a contact hole is disposed in the insulating layer at a position overlapping the first electrode when viewed from a stacking direction of the first semiconductor layer and the light emitting layer, the first wiring layer is provided to the insulating layer, and the first wiring layer is electrically connected to the first electrode via the contact hole.

According to this light emitting device, it is possible to increase the bonding strength with the external terminal such as the bonding wire.

In the light emitting device according to the aspect, the first wiring layer may be provided to the insulating layer and the contact hole.

In the light emitting device according to the aspect, the second electrode may be disposed at an opposite side of the laminated structure to the substrate, the plurality of columnar parts may be disposed in a columnar part formation region of the third semiconductor layer, when viewed from the stacking direction, the second electrode may include a first portion overlapping the columnar part formation region, and a second portion which fails to overlap the columnar part formation region, and which surrounds the first portion, and when viewed from the stacking direction, the first electrode may overlap the second portion.

According to this light emitting device, it is possible to shorten the distance between the first electrode and the columnar part formation region. Thus, it is possible to efficiently inject the electrical current into the plurality of columnar parts.

In the light emitting device according to the aspect, when viewed from the stacking direction, the first electrode may surround the plurality of columnar parts.

According to this light emitting device, it is possible to inject the electrical current with high uniformity into the plurality of columnar parts.

In the light emitting device according to the aspect, the second electrode may include a first layer, and a second layer higher in transmittance with respect to light generated in the light emitting layer than the first layer, the first layer may be lower in electrical resistivity than the second layer, the first layer may have contact with the second semiconductor layer, and the second layer may be provided to the first layer.

According to this light emitting device, it is possible to increase the transmittance with respect to the light generated in the light emitting layer while reducing the contact resistance between the second electrode and the second semiconductor layer.

In the light emitting device according to the aspect, there may further be included a second wiring layer connected to the second electrode, wherein when viewed from the stacking direction, the second layer may include a third portion overlapping the first layer, and a fourth portion which fails to overlap the first layer, and which surrounds the third portion, the second wiring layer may be connected to the fourth portion, and when viewed from the stacking direction, the second wiring layer may surround the first layer.

According to this light emitting device, it is possible to inject the electrical current with high uniformity into the first layer.

A projector according to an aspect includes the light emitting device according to the above aspect.

A display according to an aspect includes the light emitting device according to the above aspect.

What is claimed is:
1. A light emitting device comprising:
 a substrate;
 a laminated structure provided to the substrate, and including a plurality of columnar parts;
 a first electrode and a second electrode configured to inject an electrical current into the plurality of columnar parts, the first electrode being ring-shaped and completely surrounding the plurality of columnar parts in a plan view;

a first wiring layer electrically connected to the first electrode; and an insulating layer configured to cover the laminated structure and the first electrode, wherein each of the plurality of columnar parts includes
- a first semiconductor layer having a first conductivity type,
- a second semiconductor layer having a second conductivity type different from the first conductivity type, and
- a light emitting layer disposed between the first semiconductor layer and the second semiconductor layer, the first semiconductor layer is disposed between the substrate and the light emitting layer, the laminated structure includes a third semiconductor layer having the first conductivity type disposed between the substrate and the plurality of columnar parts, the first electrode is electrically connected to the first semiconductor layer via the third semiconductor layer, a contact hole is disposed in the insulating layer at a position overlapping the first electrode in the plan view, the first wiring layer is provided to the insulating layer, and the first wiring layer is electrically connected to the first electrode via the contact hole.

2. The light emitting device according to claim 1, wherein the first wiring layer is provided to the insulating layer and the contact hole.

3. The light emitting device according to claim 1, wherein the second electrode is disposed at an opposite side of the laminated structure to the substrate, the plurality of columnar parts is disposed in a columnar part formation region of the third semiconductor layer, when viewed from a stacking direction of the first semiconductor layer and the light emitting layer, the second electrode includes
- a first portion overlapping the columnar part formation region, and
- a second portion which fails to overlap the columnar part formation region, and which surrounds the first portion, and when viewed from the stacking direction, the first electrode overlaps the second portion.

4. The light emitting device according to claim 1, wherein the second electrode includes
- a first layer, and
- a second layer higher in transmittance with respect to light generated in the light emitting layer than the first layer, the first layer is lower in electrical resistivity than the second layer, the first layer has contact with the second semiconductor layer, and the second layer is provided to the first layer.

5. The light emitting device according to claim 4, further comprising:

a second wiring layer connected to the second electrode, wherein when viewed from a stacking direction of the first semiconductor layer and the light emitting layer, the second layer includes
- a third portion overlapping the first layer, and
- a fourth portion which fails to overlap the first layer, and which surrounds the third portion, the second wiring layer is connected to the fourth portion, and when viewed from the stacking direction, the second wiring layer surrounds the first layer.

6. A projector comprising:
the light emitting device according to claim 1.

7. A display comprising:
the light emitting device according to claim 1.

8. The light emitting device according to claim 1, further comprising:

a second wiring layer being laminated on the first wiring layer, wherein the second wiring layer overlaps the plurality of columnar parts, the first electrode, and the second electrode in the plan view.

9. A light emitting device comprising:

a substrate;

a plurality of columnar parts each includes a first semiconductor layer having a first conductivity type, a second semiconductor layer having a second conductivity type different from the first conductivity type, and a light emitting layer being disposed between the first semiconductor layer and the second semiconductor layer, the first semiconductor layer being disposed between the substrate and the light emitting layer;

a third semiconductor layer having the first conductivity type disposed between the substrate and the plurality of columnar parts;

a first electrode electrically connected to the first semiconductor layer via the third semiconductor layer;

a second electrode disposed on an opposite side of the plurality of columnar parts to the third semiconductor layer and electrically connected to the second semiconductor layer;

a first wiring layer electrically connected to the first electrode; and an insulating layer configured to cover the laminated structure and the first electrode, wherein the third semiconductor layer includes a first region that overlaps the plurality of columnar parts and a second region that fails to overlap the plurality of columnar parts in a plan view, the first electrode is disposed on an opposite side of the third semiconductor layer to the substrate in the second region, the second electrode includes a third region that overlaps the plurality of columnar part, and a fourth region that fails to overlap the plurality of columnar part in the plan view, and the first electrode includes a fifth region that overlaps the second electrode, and a sixth region which fails to overlap the second electrode in the plan view, the insulating layer is disposed between the first electrode and the second electrode, and between the first electrode and the first wiring layer, and the insulating layer has a contact hole through which the first wiring layer electrically connected to the first electrode, in the sixth region.

10. A projector comprising:
the light emitting device according to claim 9.

11. A display comprising:
the light emitting device according to claim 9.

12. A projector comprising:
the light emitting device according to claim 8.

13. A display comprising:
the light emitting device according to claim 8.

* * * * *